US006632380B1

(12) United States Patent
Wessling

(10) Patent No.: US 6,632,380 B1
(45) Date of Patent: Oct. 14, 2003

(54) CHEMICAL COMPOUNDS MADE OF INTRINSICALLY CONDUCTIVE POLYMERS AND METALS

(75) Inventor: Bernhard Wessling, Bargteheide (DE)

(73) Assignee: Zipperling Kessler & Co. (GmbH & Co.), Ammersbek (DE)

( * ) Notice: Subject to any disclaimer, the term of this patent is extended or adjusted under 35 U.S.C. 154(b) by 0 days.

(21) Appl. No.: 09/463,453

(22) PCT Filed: Jul. 24, 1998

(86) PCT No.: PCT/EP98/04660

§ 371 (c)(1),
(2), (4) Date: Apr. 17, 2000

(87) PCT Pub. No.: WO99/05687

PCT Pub. Date: Feb. 4, 1999

(30) Foreign Application Priority Data

Jul. 25, 1997 (DE) .......................................... 197 32 383

(51) Int. Cl.[7] ................................................. H01B 1/12
(52) U.S. Cl. .......................... 252/500; 252/519.2; 546/8
(58) Field of Search ............................... 252/500, 512, 252/519.2; 528/210, 378, 423; 546/1, 2, 8

(56) References Cited

U.S. PATENT DOCUMENTS

| 5,182,050 | A | | 1/1993 | Joyce | |
|---|---|---|---|---|---|
| 5,225,110 | A | * | 7/1993 | Kathirgamanathan | ....... 252/512 |
| 5,264,157 | A | * | 11/1993 | Bidan et al. | ................ 252/519 |
| 5,532,025 | A | | 7/1996 | Kinlen | |
| 5,597,471 | A | | 1/1997 | Ragge | |
| 5,720,903 | A | | 2/1998 | Wessling | |
| 5,840,363 | A | | 11/1998 | Rosch | |
| 5,846,606 | A | | 12/1998 | Wessling | |

FOREIGN PATENT DOCUMENTS

| DE | 37 16284 A1 | 5/1987 |
|---|---|---|
| WO | WO94/04591 | 3/1994 |
| WO | WO94/26082 | 11/1994 |
| WO | 94 27297 | 11/1994 |
| WO | WO97/20084 | 6/1997 |

OTHER PUBLICATIONS

Olmedo, L. et al., "Microwave properties of organically based materials", 1995:81675, Abstract.
Epstein, A.J. et al., "Sulfonated polyaniline salt compositions", 1991:633231, Abstract.
Kinlen et al: "Corrosion protection using polyaniline coating formulations" International Conference on Science and Technology of Synthetic Metals (ICSM '96), Snowbird, UT, USA,Jul. 28–Aug. 2, 1996, vol. 85 No. 1–3, pp. 1327–1332, XP002083652, ISSN 0379–6779, Synthetic Metals, Feb. 15, 1997, see p. 1328, col. 2, para 2.
Patent Abstracts of Japan, vol. 012, No. 128 (C–489), Apr. 20, 1988 & JP 62 246926, Oct. 28, 1987.
Chen et al: "Doping of Polyaniline Via Pseudoprotonation by an Ionic Salt", Advanced Materials, vol. 7, No. 5, May 1, 1995, pp. 473–475,XP000533524.
Sauerland et al: "A mass spectrometric investigation of polyaniline using photoionization", Synthetic Metals, Sep. 30, 1996, vol. 82, No. 3, pp. 193–199, XP002083653, ISSN 0379–6779, p. 197, col. 2, para 2.
Neoh et al: "Structural dependence of polyanilines on reaction medium", Synth Met; Synthetic Metals Apr. 15, 1991, vol. 40, No. 3, Apr. 15, 1991 pp. 341–354, XP002083654, see p. 342, para 3.
Lachkar et al: "Metallization of polythiophenes, IV Interaction of vapor–deposited Cu and NI with poly 3–(1,1,1,2,2, 3,3,4,4,5,5,6,6,–tridecafluoro nonyl)thio phene (P3TT)", Synthetic Metals, Dec. 30, 1995, vol. 75, No. 3, pp. 195–200, XP002083655, ISSN 0379–6779, p. 200, col. 1, para 2.
Inoue et al: "Complexation of electroconducting polypyrrole with copper", Synthetic Metals, Sep. 1, 1990, vol. 38, No. 2, pp. 205–212, XP002083656, ISSN 0379–6779 see fig. 3.

* cited by examiner

Primary Examiner—Mark Kopec
(74) Attorney, Agent, or Firm—Pillsbury Winthrop LLP

(57) ABSTRACT

Compounds of intrinsically conductive polymers, in particular polyanilines, with metals, their preparation and uses of these compounds are described.

Figure 1:
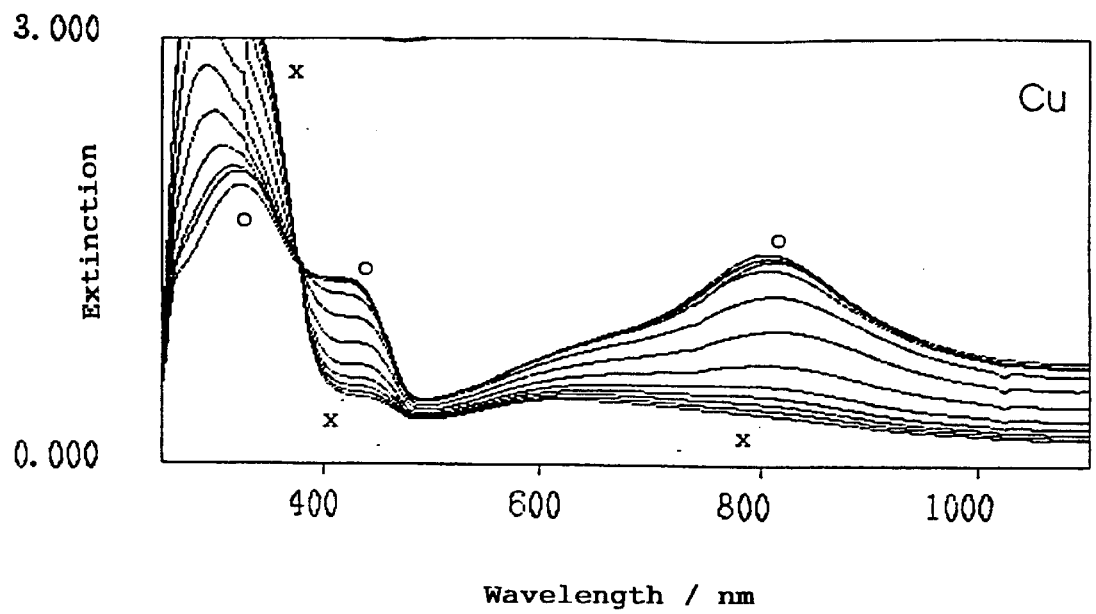

20 Claims, 5 Drawing Sheets continuously solderable up to 1.2 m² virtually linear Cu:Sn = 2.2:1

CHEMICAL COMPOUNDS MADE OF INTRINSICALLY CONDUCTIVE POLYMERS AND METALS

This application is the national phase of international application PCT/98/04660 filed Jul. 24,1998 which designated the U.S.

The invention relates to chemical compounds of intrinsically conductive polymers, in particular polyanilines, with metals, their preparation and uses of these compounds.

Compounds of conjugated and intrinsically conductive polymers, such as polyanilines (poly-phenylenamines), with metals are not yet known.

"Conjugated and intrinsically conductive polymers" which are a component of the compounds according to the invention are understood as those organic polymers and derivatives thereof which have polyconjugated bond systems (e.g. double bonds, aromatic or heteroaromatic rings or triple bonds). Examples of such polymers are polydiacetylene, polyacetylene (PAc), polypyrrole (PPy), polyaniline (PAni), polythiophene (PTh), polyisothianaphthene (PITN), polyphenylenevinylene, polyheteroarylenevinylene (PArV), it being possible for the heteroarylene group to be e.g. thiophene or pyrrole, poly-p-phenylene (PpP), polyphenylene sulphide (PPS), polyperinaphthalene (PPN), and derivatives thereof (which are built up e.g. from substituted monomers), copolymers thereof with other monomers and physical mixtures thereof. They can exist in various states, which are described by in each case different empirical formulae and can be converted into one another usually substantially reversibly by (electro)chemical reactions, such as oxidation, reduction, acid/base reaction or complex formation. These reactions are occasionally also described in the literature as "doping" or "compensation", or can be regarded as "charging" and "discharging" analogously to the electrochemical processes in batteries. At least one of the possible states has a very good electrical conductivity, e.g. has a conductivity of more than 1 S/cm (as the pure substance), so that they can be referred to as intrinsically conductive polymers.

A good overview of intrinsically conductive polymers which have already been synthesized and are suitable according to the invention is to be found in Synthetic Metals, issues 17, 18 and 19 (1987) and vol. 84–86 (1997).

Such conductive polymers have also already been used in the metallization of printed circuit boards (see WO-A-97/20084). They have also found use in corrosion protection (see WO-A-95/00678).

The invention is based on the object of providing electrically conductive compounds, the conductivity of which is less sensitive to changes in pH than that of conventional conductive polymers and which show advantages over conventional conductive polymers in their use in the production of printed circuit boards or in corrosion protection.

This object is achieved by the compounds disclosed herein. The invention also relates to the process for making such compounds and to the uses of these compounds for metallizing substrates, in printed circuit boards and for protection of metal surfaces from corrosion.

The compounds according to the invention are those of intrinsically conductive polymers with metals. Compounds of this type are not yet known.

It has been found that intrinsically conductive polymers surprisingly can form true chemical compounds with metals, and the polymer-metal compounds prepared are also electrically conductive.

On the basis of the investigations carried out, it is assumed that the compounds are built up in the manner of a copolymer of the following general formula (I).

$$[(DU)_{a-x}(Me^{a+})_x(DU_{ox}H^+)_y](a \cdot x+y)A^- \qquad (I)$$

wherein

DU=a dimer unit of the polymer, $DU_{ox}$=an oxidized form of the dimer unit, $Me^{a+}$=a metal ion of valency a, a=the valency of the metal ion, x=an integer from 1 to 10,000, y=an integer from 0 to 10,000, A=an anion.

It is further assumed that the metal is bonded chemically to the dimer unit, and that each dimer unit is capable of bonding a monovalent metal ion. For bonding of a divalent metal ion, on the other hand, at least two dimer units are required. The dimer units can also be present in doped form. Examples of dimer units DU are given below for polypyrrole, polythiophene, polyacetylene and polyaniline.

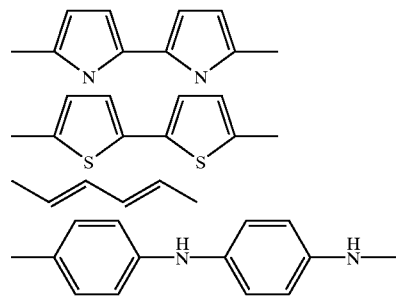

Possible anions are, in particular, monovalent anions, such as chloride, toluenesulphonate or dodecylbenzenesulphonate. Polyvalent anions are also possible, but these are then present in a correspondingly lower number.

Accordingly, preferred compounds of polyaniline with iron and copper probably correspond to the following formulae (II) and (III).

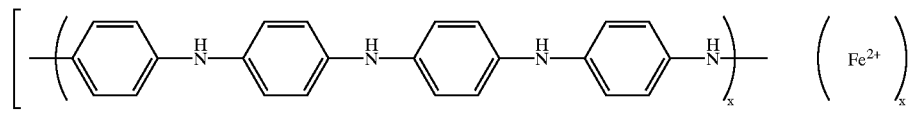

(II)

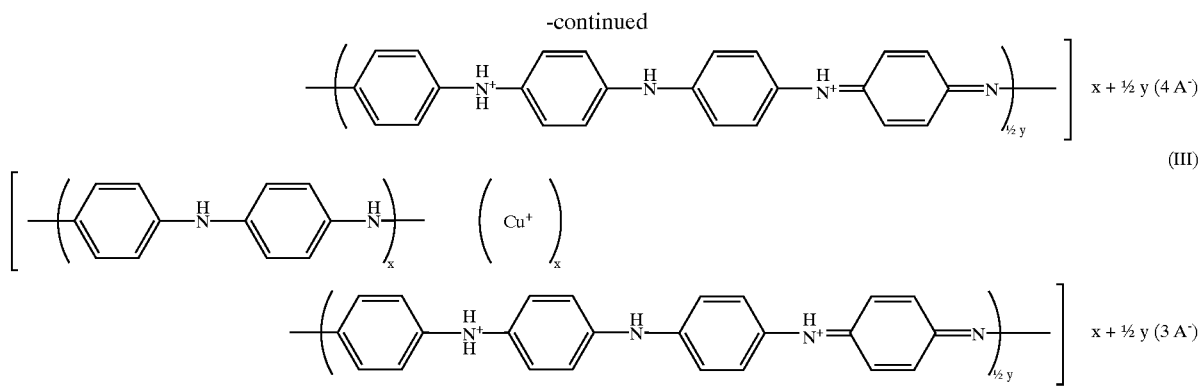

(III)

As a rule, the metals are present in the compounds according to the invention as mono- or polyvalent positive ions, the exact oxidation level not being essential for the invention but depending on the surrounding conditions. The metal can also have the oxidation level of zero e.g. as a result of an internal redox reaction with the polymer.

However, those polymers which are built up by the "shish-kebab" principle, i.e. in which the electron-rich monomer units are stacked on top of one another, such as e.g. in polyphthalocyanines, are unsuitable as polymers according to the invention.

It has not yet been possible to clarify the nature of the chemical bond between the metal and the polymer in the compounds. It could possibly be a complex bond. At any rate, stoichiometrically defined compounds with a content of from just above zero up to 50 mol % of a monovalent ion, up to 25 mol % of a divalent ion etc., based on the moles of monomer in the polymer, are possible.

Only intrinsically conductive polymers in which electron-rich structural elements such as double bonds or aromatic or heteroaromatic ring systems overlap and which have been rendered conductive by protonation with Brönstedt acids or oxidation with Lewis acids, i.e. by a so-called doping, are as yet known in the prior art. However, no compounds in which chemical bonds exist between the polymer and a metal as in the compounds according to the invention are as yet known.

The compounds according to the invention preferably contain as the metal iron, copper, zinc, magnesium, cadmium or tin. Iron and copper are particularly preferred here.

Polyacetylene, polypyrrole, polythiophene, polyphenylenevinylene and, in particular, polyaniline are preferred as the intrinsically conductive polymer.

The compounds according to the invention are preferably in the form of dispersions in aqueous or organic dispersing agents or in the form of paints or polymer blends containing them. In addition to the compounds according to the invention the polymer blends comprise further polymers, copolymers or polymer mixtures, such as polyamides, polyesters, polyethers, such as polyethylene oxides, copolymer latices on an aqueous basis, such as vinyl acetate/butyl acrylate, or other copolymer latices, and/or polyvinyl alcohols. Particularly preferred further polymers are polyamides.

Furthermore, preferred compounds are those of polyaniline with copper, iron or zinc, which, as dispersions in N-methylpyrrolidone and iso-propanol, on spectroscopic analysis in the UV-VIS-NIR range, have absorption maxima at wavelengths of

| | |
|---|---|
| copper-polyaniline compound | 285 ± 5 nm, |
| iron-polyaniline compound | 280 ± 5 nm, |
| zinc-polyaniline compound | 332 ± 5 nm. |

The metal-polymer compounds according to the invention can be prepared by a process in which
(a) a dispersion of an intrinsically conductive polymer is brought into contact with the chosen metal in elemental form, wherein
(b) the dispersion medium is agitated in order to ensure exchange of matter at the interface between the metal and dispersion, and
(c) the dispersion is brought into contact with the metal until the metal-polymer compound has formed.

Re (a): Possible dispersions are those in water or aqueous solvents or in organic solvents. Suitable dispersion are described e.g. in WO-A-97/20084 and DE-C-38 34 526. The metal is employed in elemental form, e.g. in the form of foils, sheets or granules.

Re (b): It is essential that the dispersion medium is agitated, since otherwise only deposition of layers of the conductive polymer on the metal and not the formation of the compounds according to the invention occurs. The agitation of the dispersion medium can take place e.g. by means of conventional stirrers or also by the medium flowing past the metal.

Re (c): It has been found that a brief immersion of the metal in a dispersion of the polymer chosen is not sufficient to form the compounds according to the invention. Rather, longer contact is necessary. The period of time required in the individual case can be determined by monitoring the course of the reaction e.g. by UV-VIS-NIR spectroscopy. The formation of the metal-polymer compounds is indicated here by a constant change in the spectrum. A complete reaction under the conditions chosen is achieved when no further changes can be detected in the spectrum.

As a rule, the contact between the metal and polymer dispersion is carried out over a period of 0.1 to 10,000 min, and preferably 1 to 1,000 min.

Stage (c) can optionally be followed by a further step with which the metal-polymer compound formed is separated off from the dispersion. For this, the dispersion can be filtered, for example, and the metal-polymer compound filtered off can be washed and dried.

The compounds according to the invention can furthermore also be prepared by a process in which a dispersion of a reduced form of the intrinsically conductive polymer is brought into contact with ions of the chosen metal. To prepare the reduced form, the polymer can be reacted e.g. with sodium borohydride.

The course of the reaction here can again be monitored e.g. by spectroscopy, and when the reaction has ended the metal-polymer compound formed can be separated off in the manner described above.

Further investigations of the formation of the metal-polymer compounds led to the assumption that even when the reaction conditions are varied, electron transfer between the conductive polymer and the metal and therefore a redox reaction between these starting materials evidently always occurs. By changing the reaction conditions, compounds which are distinguished e.g. by different contents of bonded metal can be obtained in the individual case. Thus e.g. the content of metal can be influenced via the duration of the contact with the dispersion and the degree of agitation of the dispersion medium. With a longer reaction time and more vigorous agitation, higher metal contents in the compounds prepared are achieved here.

The preparation procedures described in the following and in the examples relate to polyaniline, but they can also be applied to other intrinsically conductive polymers.

Figure 2:
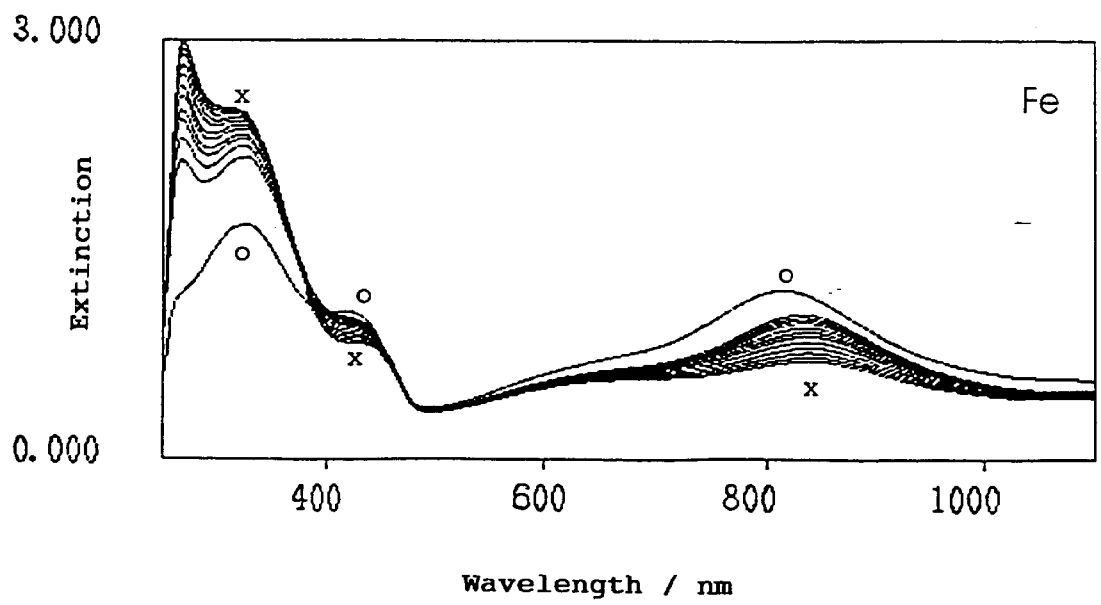
Figure 3:
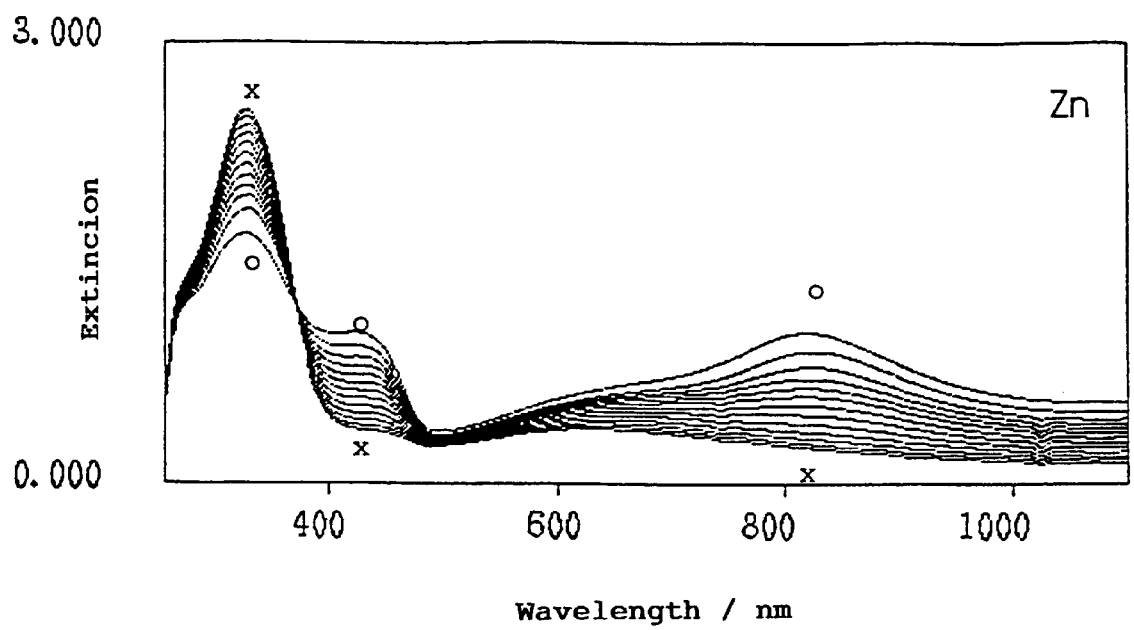
Figure 4:
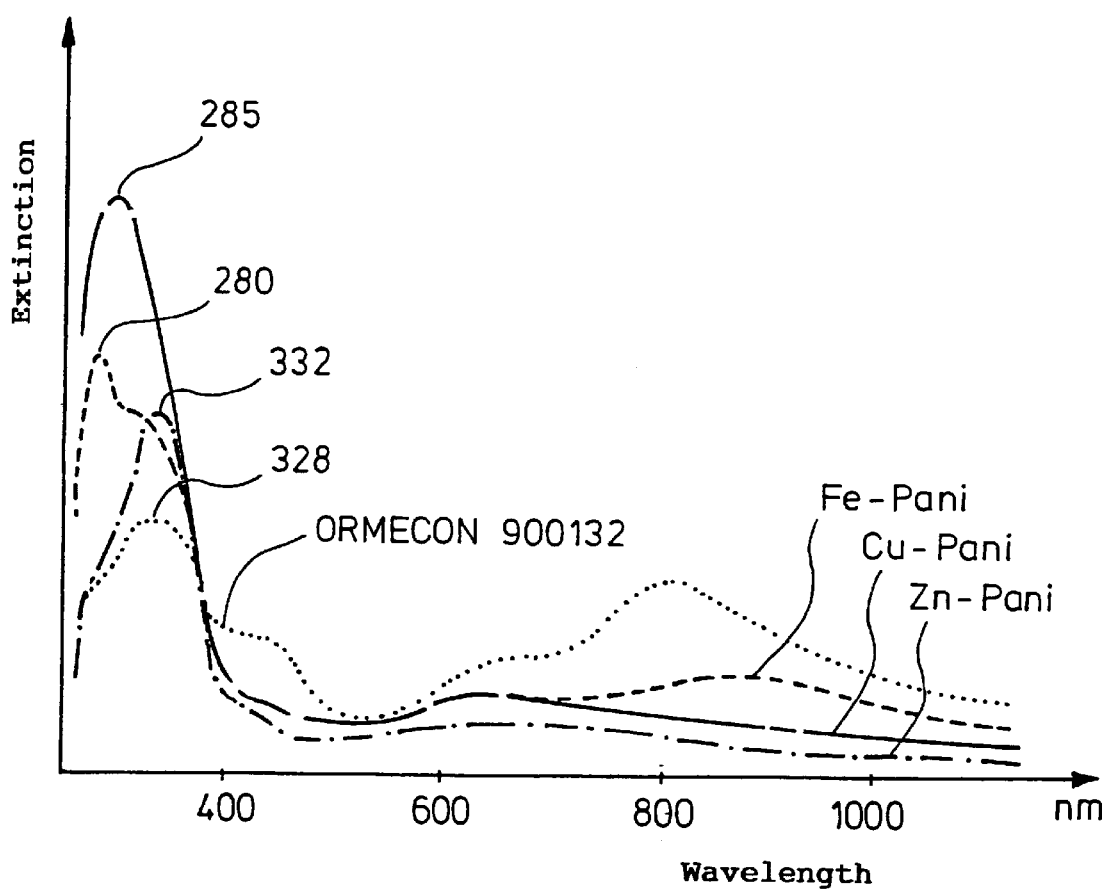

A more detailed investigation of the reaction in the preparation of the metal-polymer compounds according to the invention was undertaken by adding metal pieces of copper, iron and zinc to a dispersion of polyaniline in a mixture of N-methylpyrrolidone (NMP) and iso-propanol, such as is disclosed in DE-C-38 34 526, and regularly analysing this mixture by spectroscopy, with constant stirring (example 1). The spectra of the starting mixture and the changed spectra recorded in the course of the reactions, designated FIGS. 1 to 3, resulted. In FIG. 4 the starting spectrum and the end spectra are superimposed in order to illustrate the changes which have occurred.

It is remarkable here that each metal-polyaniline compound gave a different spectrum. This suggests the assumption that each compound has a different structure and different interactions occur between the electrons of the polyaniline and of the metal. The continuous change in the spectra indicated the course of the reaction, i.e. the formation of the new chemical compounds.

The change in the spectra followed a uniform pattern in all the reactions. The intensity of the polyaniline band at about 800 nm decreased in all cases. In the case of the Fe compound, the maximum of the band was shifted to higher wavelengths, in the case of copper to lower wavelengths, and in the case of zinc the band disappeared completely, and only the band at approx. 640 nm was still visible.

The band at approx. 430 nm also decreased in intensity in all cases, in the case of Fe again to a lesser extent than with Cu and Zn.

The band at approx. 325 nm and the shoulder at 280 nm were intensified in all cases. Clear isobestic points are found in all cases. In the case of Fe a new absorption maximum was formed at 280 nm with a shoulder at 320 nm, in the case of Cu a very intense maximum was formed (more intense than with Fe) at approx. 282 nm (no fine structure), and in the case of Zn a maximum was formed at 332 nm (which is about as intense as the shoulder of the Fe compound), while the Zn compound shows only s weak shoulder at 280 nm, where the Fe compound has an intense maximum.

Mixtures of dispersion of pure conductive polymers with ions of the corresponding metal investigated for comparison gave spectra which corresponded to those of the pure polymers and thus differ significantly from the spectra of the compounds according to the invention. This is further evidence of the formation of the metal-polymer compounds.

In another experiment (example 2), reactions of metals in an aqueous dispersion of polyaniline were carried out. For the individual metals, the concentrations in the dispersion shown in table 1 in example 2 were found after the reaction had ended. After the dispersed polyaniline had been flocculated out, a significantly lower amount of metal ions was found in solution, which demonstrates that the predominant portion is present bonded in the polyaniline.

Table 2 in example 2 furthermore shows a remarkable behaviour, which is not yet understood completely. Columns (A), (B) and (C) show the pH of the aqueous polyaniline dispersion (starting value: 3.2) (A) after the reaction, (B) after dilution of the dispersion (1:20 for the purpose of the spectroscopic analysis) and (C) after leaving to stand for one month. It is first striking that for some metals, namely Sn and Fe, no or almost no change in pH compared with the starting value is to be recorded under (A). With other metals, such as Cu or Zn, a significant increase in pH occurs, and with Cd and Mg even a significant change to pH values of more than 7 occurs.

On dilution in water the expected effect (B) results, but not so on leaving to stand for one month (C). Some dispersions remained pH-stable, others showed an increasing and again others a decreasing pH.

It is known that pure polyaniline shows a change in colour from green to blue at a pH of 3.5 to 4 and therefore has a blue colour at higher pH values. In contrast, the compounds obtained show completely surprising colours. While the Cu compound is already blue at pH 5–6 and the Mg compound at pH 7–10, the Zn compound is green at a pH of 5–6. The Cd compound is also green, although it caused a pH of sometimes more than 7.

The changes in pH, which generally tend in the direction of a higher pH, are currently also not understood, with the exception of Mg, where evolution of hydrogen takes place as a side reaction. If it were assumed that the metal replaced corresponding protons on bonding to the polymer, these would have to be released and lower the pH. However, this is evidently not the case. Instead, protons are evidently consumed, as the increase in the pH shows. This behaviour could be explained under the assumption that during the formation of the compounds according to the invention a true electron exchange occurs between the metal and the polyaniline, as a result of which the latter is reduced to lecuoemeraldine. This process could therefore be characteristic of the formation of the new class of compounds.

The compounds according to the invention are furthermore distinguished by the fact that the metal cannot be extracted from them. Thus e.g. after suspending the iron-polyaniline compound in water and separating off the compound virtually no iron was to be detected in the water.

The preparation of the metal-polymer compounds which is described in example 3 is particularly suitable for industrial scales. It has also been found that a compound which contains the maximum amount of metal which can be bonded is not absolutely necessary in all cases. In many cases compounds which contain a smaller amount are sufficient.

Further investigations showed that the compounds according to the invention prepared are, within the measurement accuracy, as conductive and also comparatively readily dispersible as the comparable metal-free polyaniline (see table 3 in example 3).

The metal compounds moreover have interesting properties which are important for use in practice. They can be employed e.g. as electrical conductors or as components of antistatic or conductive coatings. They can also be used inter alia in the shielding of electromagnetic waves (EMI shielding) or in protection against static charging, e.g. as films. Electrical components and sensors can furthermore be produced from them. In all these uses the metal-polymer compounds are employed in the conventional manner, like the corresponding conductive polymers. As a rule, they are therefore shaped in a suitable manner, after any conversion into a polymer blend, and processed to the desired articles, such as films or electrical conductors or components, or they are incorporated into suitable compositions, in order e.g. to obtain coating compositions, which are then further processed in the conventional manner.

The invention particularly relates to the use of the compounds according to the invention in the metallization of substrates, in the production of electrical printed circuit boards and in the protection of metallic objects against corrosion. In metallization here, the compound is applied to the chosen substrate and the coated substrate is then brought into contact with the metallizing solution, in order to achieve the deposition of metal. In the production of electrical printed circuit boards, the compound according to the invention is likewise applied to the printed circuit board as a pretreatment, and the printed circuit board is then metallized in the conventional manner, in particular tin-plated. The use of a copper-polyaniline compound, which leads to an excellent solderability in the printed circuit boards produced, is particularly suitable in this connection. In corrosion protection, compositions with a content of compound according to the invention, such as e.g. paints, are applied to the metallic object to be protected. This can be followed by conventional further steps for corrosion protection (see in particular WO-A-95/00678).

In all these cases, suspensions of the compounds according to the invention are preferably employed.

Figure 6:
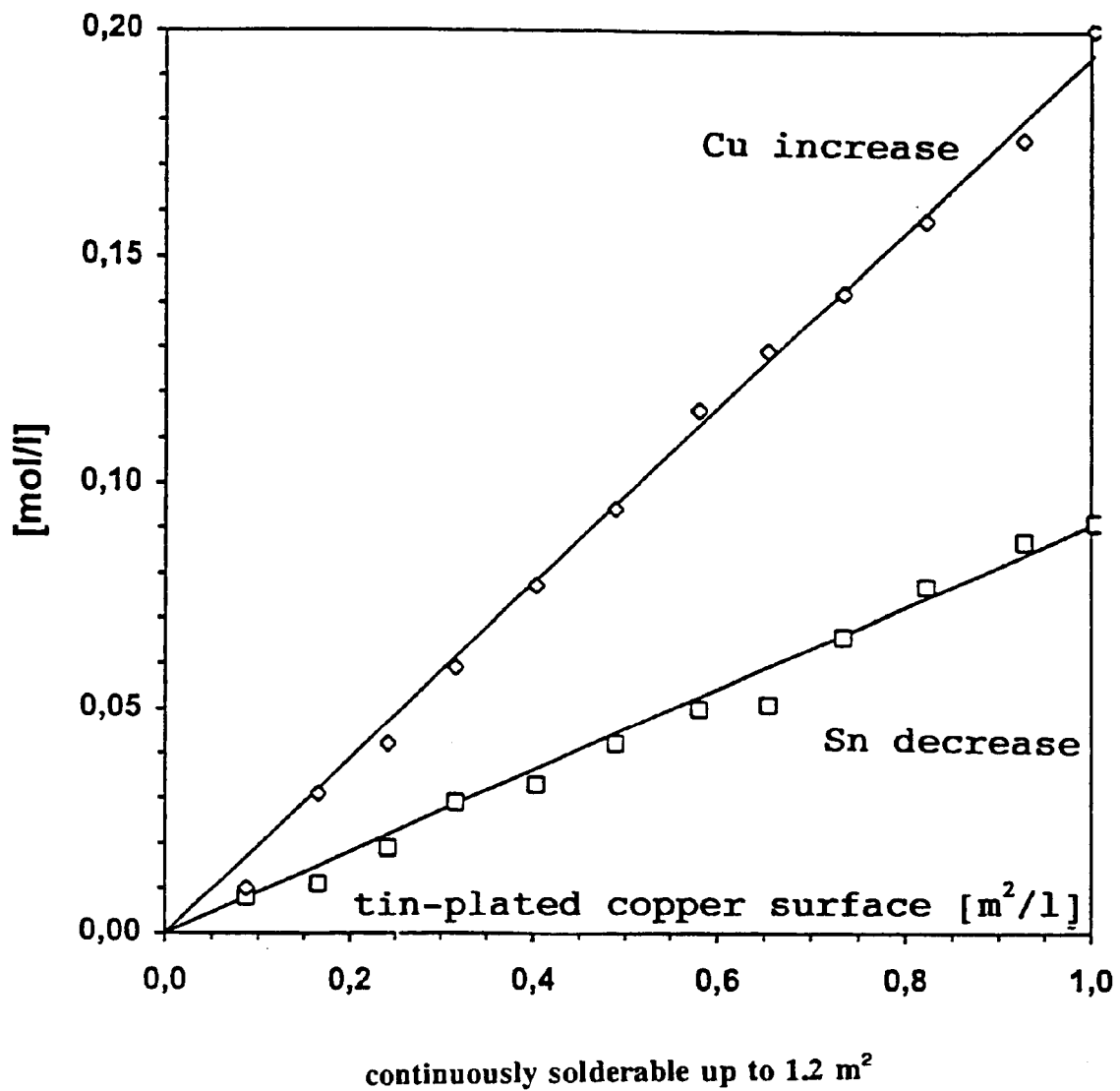

A pretreatment of printed circuit boards with an aqueous dispersion of the Cu-polyaniline compound according to the invention carried out before the chemical deposition of tin from corresponding tin baths furthermore leads, for example, to a solderability of the printed circuit boards over a very wide range of tin concentrations, as FIG. 6 of example 4 shows. In contrast, a Cu-free conventional polyaniline dispersion in practice leads to irregularities and non-reproducible solder results, and from concentrations of 0.02 mol Cu/liter of tin bath to tin end surfaces which are not solderable. If a conventional polyaniline dispersion according to WO 97/20084 is used as a pretreatment before the chemical deposition of tin, an improvement compared with conventional chemical tin deposition processes without pretreatment with conductive polymers indeed results, but solderability no longer exists below 20 g tin/liter of tin bath. The Cu:Sn ratio is at most only 1.6:1, although a ratio of greater than or equal to 2.0:1 is necessary for 100% solderability over the entire range of the Sn and Cu concentration.

Corrosion protection processes can furthermore be carried out significantly faster and more reproducibly if compositions which comprise compounds according to the invention, and preferably an Fe-polyaniline compound, instead of conventional metal-free polyaniline are employed. A polyaniline containing 0.05–0.4 per cent by weight of Fe (which corresponds to about 15 Fe ions per primary particle) is already adequate for this purpose. A preferred corrosion protection process is described in WO 95/00678, the entire disclosure of which is included in this Application by reference.

These advantages apply in particular to water-based polyaniline-containing paints. Aqueous paints rather have the disadvantage here that they initiate corrosion processes, instead of preventing these, during application and drying. This can be seen by the fact that rust forms during the drying process of the paint applied to iron-containing materials. On the other hand, if in particular an Fe-polyaniline compound according to the invention is used, this rust formation is not observed.

Finally, corrosion protection of lightweight metals, such as Mg and its alloys, with intrinsically conductive polymers, such as polyaniline, is impossible or possible only with difficulty. On the other hand, if e.g. an Mg-polyaniline compound is used, an excellent passivity with respect to corrosive media is achieved, as is shown by the significantly reduced formation of white Mg corrosion products, such as chiefly magnesium oxides and hydroxides, when a salt spray test is carried out in accordance with DIN 50021.

Polyaniline is moreover known for the fact that it changes its conductivity with the pH of the surrounding medium. At a pH of 7, for example, it has lost its conductivity completely, when thin films are measured, and has a value e.g. of only $10^{-9}$ S/cm. The metal-polymer compounds according to the invention have the property of reacting considerably more slowly to a pH change. Thus, powders of iron-polyaniline compounds have a starting conductivity (as a pressed article) of e.g. 5 S/cm. After suspending in aqueous media at pH values of 3, 7 and 9 and subsequent drying, conductivities of 0.034, 0.032 and 0.004 S/cm respectively result. In contrast, polyaniline powder had, for example, a conductivity of only 0.0004 S/cm at pH 7, i.e. the conductivity is lower by a factor of about 100.

The invention is explained in more details in the following with the aid of examples.

EXAMPLES

Example 1

A colloidal dispersion of polyaniline in organic solvents, obtainable as ORMECON® 900132 from Ormecon Chemie, Germany, was first diluted in a ratio of 1:10 with isopropanol and analysed spectroscopically in the UV-VIS-NIR range in a quartz glass cell (for spectroscopy). The resulting absorption spectrum is designated "ORMECON® 900132" in FIG. 4.

Corresponding dispersions were then prepared and the metals Fe, Cu and Zn in the form of strips were added, with constant stirring. Samples were taken regularly and analysed by spectroscopy. The spectra obtained for copper in FIG. 1, for iron in FIG. 2 and for zinc in FIG. 3 resulted, in each case the starting spectrum being designated o and the end spectrum x in the figures. Spectra were recorded every 5 minutes, and after somewhat more than 1 hour no further change was detectable, which indicated the end of the reaction and the obtaining of the end spectrum. To illustrate the changes which occurred, FIG. 4 shows the starting spectrum for ORMECON® 900123 and the resulting end spectra for the various metal-polyaniline compounds, "Pani" representing polyaniline.

Example 2

An aqueous dispersion of polyaniline which comprises 0.013 mol p-toluenesulphonic acid and is obtainable as ORMECON® PCB 7000 from Ormecon Chemie, Germany was diluted in a ratio of 1:20 with water, and plates or granules of various metals were added for 12 h. The metal contents in the resulting dispersions were analysed, in some cases by means of plasma atomic emission spectral analysis. From the concentrations obtained, the base value according to table 1 determined for the particular metal was subtracted in order to be able to draw a better conclusion as to the metal content of the compounds produced, and the resulting corrected values are shown in table 2 under "AE".

For a comparison of these values with data obtained by methods of wet chemistry, the following steps were carried out separately from one another in the case of Cu and Fe after the reaction had ended (a) Flocculation of the dispersion with NaCl, filtration and quantitative determination of the metal content in the filtrate by titration with aqueous disodium ethylenediaminetetraacetic acid solution (Titriplex (III) from Merck, Germany), the indicators employed being 5-sulphosalicylic acid for iron, 4-(2-pyridylazo)-resorcinol for copper, xylenol orange for tin and an indicator buffer tablet from Merck, Germany for iron.

(b) For comparison, oxidative breakdown of the entire dispersion by means of $HNO_3$ and quantitative determination of the metal content in the resulting mixture, as described for (a), were carried out.

Finally, after the reactions had ended, the "base value", i.e. the degree of dissolution of metal which originates solely from contact with the p-toluenesulphonic acid present in the dispersion, was determined. For this (c) the metals were added to an aqueous 0.013 molar solution of p-toluenesulphonic acid and the resulting content of metal in the solution was determined as in (a) and by means of atomic emission spectral analysis.

The metal concentrations determined according to (a), (b) and (c) are shown in table 1. The concentration determined by wet chemistry according to (b) is composed of the base value and the metal bonded in the polyaniline. The significantly higher value than the base value moreover shows that compared with the dissolving of metal due to the acid present, a chemical reaction predominantly takes place between the polyaniline and the metal. The values also determined by wet chemistry according to (a) demonstrate that substantially no more metal than in the base value determination dissolves.

TABLE 1

| Metal | Conc. after flocculation with NaCl (mg/l) (wet chemistry) | Conc. after oxidative breakdown (mg/l) (wet chemistry) | Base value (mg/l) | |
|---|---|---|---|---|
| | | | AE | Wet chemistry |
| Cu | 38.13 (±3.81) | 50.9 (±5) | 24.34 | 28.8 |
| Fe | 9.05 (±0.3) | 61.3 (±2.15) | 14.71 | 27.8 |
| Zn | — | — | 11.24 | 11.6 |
| Mg | — | — | 32.6 | 25.4 |

In the following table 2, the particular net values found, which were obtained after subtraction of the base values from the gross concentrations, are stated under "AE" and "Wet chemistry"

The results of the atomic emission spectral analysis "AE" show a good agreement with the results determined by wet chemistry.

Table 2 also shows the percentage content in wt. % of metal determined by a wet chemistry route or by means of plasma atomic emission spectral analysis "AE", the calculated number of dimers per metal ion, the colours of the resulting dispersions of the metal-polymer compounds when the reaction has ended and after one month and, under (A), (B) and (C), the pH values of the aqueous polyaniline dispersion (starting value: 3.2) (A) after the reaction, (B) after dilution of the dispersion (1:20 for the purpose of the spectroscopic analysis) and (C) after leaving to stand for one month.

TABLE 2

| Sample | AE (mg/l) | Wet chemistry (mg/l) | % metal in polyaniline AE/wet chemistry | Dimers per metal ion | Colour after the reaction | (A) pH | (B) pH (1:20) | (C) after 1 month | Colour after 1 month |
|---|---|---|---|---|---|---|---|---|---|
| Copper | 22.73 | 22.1 | 42/41 | 0.25 | blue | 5.3 | 5.7 | 6.0 | blue |
| Iron | 46.15 | 33.5 | 85/62 | 0.1 | green | 3.1 | 5.1 | 5.8 | green |
| Zinc | 18.32 | 34.6 | 34/45 | 0.36 | green | 6.4 | 7.5–>5.7* | 5.7 | green |
| Magnesium | 12.76 | 12.1 | 24/22 | 0.22 | blue-violet | 9.7 | 8.7 | 6.8 | green |
| Tin | — | — | — | — | yellow-green | 3.2 | 4.9 | 4.9 | yellow-green |

TABLE 2-continued

| Sample | AE (mg/l) | Wet chemistry (mg/l) | % metal in poly-aniline AE/wet chemistry | Dimers per metal ion | Colour after the reaction | (A) pH | (B) pH (1:20) | (C) after 1 month | Colour after 1 month |
|---|---|---|---|---|---|---|---|---|---|
| Cadmium | — | — | — | — | yellow-green | 7.3 | 7.2 | 6.4 | yellow-green |
| Ormecon PCB 7000 | — | — | — | — | — | 3.2 | 5.0 | 5.4 | — |

*drops very rapidly after dilution

Example 3

Polyaniline was prepared by the procedures described in WO 89/02155. However, the finished reaction suspension was not yet filtered after the heating up, but divided into several samples. Plates of copper, iron, zinc and magnesium were each hung in these samples. After 12 h with constant stirring, the weight of the metal plates had decreased, as can be seen from the following table 3. The resulting suspensions were then filtered, and worked up as described in WO-A-89/02155 and U.S. Pat. No. 5,281,363. Washing several times with water and p-toluenesulphonic acid solution and then drying were carried out here. The filtrates and the combined wash waters obtained after a total of 4 washings were analysed by wet chemistry for their metal content; the contents found are shown in table 3. The resulting dry powders were characterized by elemental analysis and investigated for their conductivity (see table 3). A comparison of the absolute weight loss of metal with the absolute amount of metal bonded in the dry powder isolated and the absolute amount of the portion of dissolved metal not bonded in the filtrates/wash waters gave the "deviation" shown in table 3.

Example 4

Printed circuit boards which had a test structure and were produced up to the stage of the cured solder resist were treated in 3 different ways:

1. Etching; rinsing; chemical tin-plating with a tin bath based on tin salts, methanesulphonic acid and thiourea, obtainable as UNIKRON OA8 from Cimatech, Germany.
2. Etching; rinsing; pretreatment for 1 minute with an aqueous dispersion of polyaniline, obtainable as ORMECON® PCB 7000 from Ormecon Chemie, Germany; rinsing; tin-plating with UNIKRON OA8.
3. Etching; rinsing; pretreatment with an aqueous dispersion of a Cu-polyaniline compound which was prepared by reacting an aqueous dispersion of ORMECON® PCB 7000 with Cu for 16 h according to example 2; rinsing; tin-plating with UNIKRON OA8.

In all 3 test series, boards were processed until 1 m² Cu/l UNIKRON OA8 had been treated. The Cu and Sn concentrations were determined and plotted on graphs against the tin-plated copper surface per l of tin-plating bath.

Figure 5:
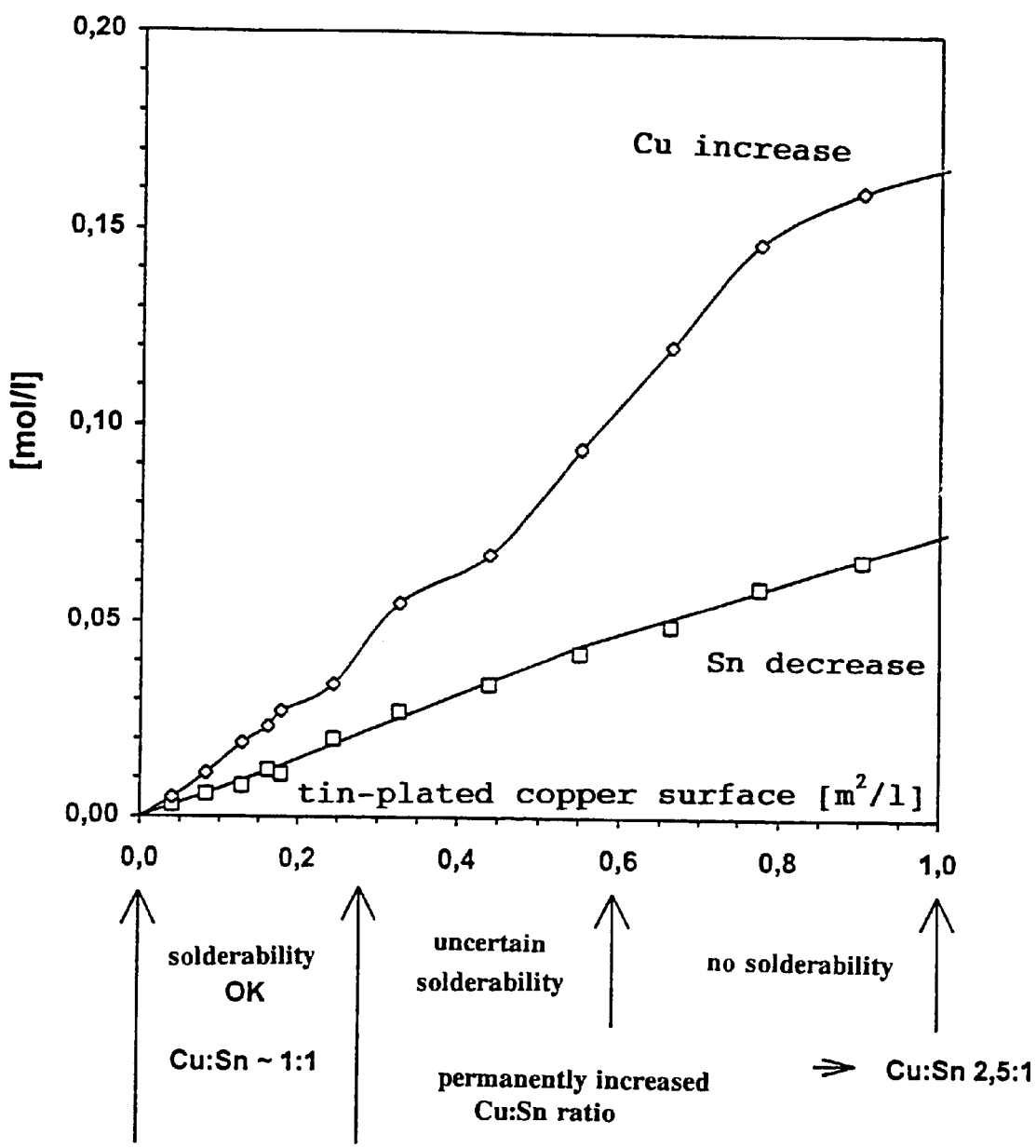

The resulting curves for test series 1 and 2 are practically identical and are shown in FIG. 5. They show a non-linear

TABLE 3

| Metal | Weight loss [g] | Metal in solution [g] | Dry weight PAni [g] | Metal bonded [%, g] elemental analysis | Deviation [%] | Metal bonded[1] [g] | Number of dimers per metal ion[1] | Conductivity (S/cm) |
|---|---|---|---|---|---|---|---|---|
| Copper | 10.6 | 7.6 | 217 | 1.24/2.7 | 2.55 | 3 | 12 | 5 |
| Iron | 32.2 | 14.6 | 210 | 0.05/0.1 | 54.3 | 17.6 | 2 | 5 |
| Zinc | 19.7 | 10.4 | 119 | 0.15/0.3 | 0.6 | 9.3 | 2.4 | 8 |
| Magnesium | 39.8 | 37.7 | 116 | 0.24/0.09 | 7 | 2.2 | 3.6 | 3 |

[1]Hypothetical values assuming that the metal not in the solutions is bonded in the polyaniline
-Dry weight of PAni: weight of the polyaniline employed According to this table, good figures result for all the metals except iron, i.e. the amount of metal which has reacted can be found either in solution or bonded in the powder within an acceptable error (in view of the numerous potential losses during the washing and filtration steps). In spite of numerous repetitions, however, a discrepancy remained with iron. Since the analysis of iron in solution presents no problems, the bonding to the polyaniline appears to be so strong that volatile oligomer compounds are formed and parts of Fe are therefore removed from the analysis during the pyrolytic preparation of the sample. There are corresponding observations in this respect.

development of the Cu and Sn concentrations. Solderability (after ageing for 4 h/155° C., remelting 3 times in a reflow oven, solder test on a solder shaft and evaluation in accordance with IPC-A 600 C-D) practically no longer exists from 0.25 m² Cu/i of bath (=0.03 mol Cu or 0.015 mol Sn/l). The molar ratio of Cu:Sn is initially 1:1 and then changes non-linearly up to more than 2.5:1.

In contrast, in test series 3 with a Cu-polyaniline compound according to the invention a completely different behaviour was to be found, as shown in FIG. 6. In this series there was a linear change in the Cu and Sn concentrations over the entire range, with a Cu:Sn ratio of 2.2:1, which practically corresponds to the ideal value of 2:1 and therefore an overall reaction of $2\ Cu^0 + Sn^{2+} \rightarrow Sn^0 + 2\ Cu^+$. Reliable solderability existed up to a tin-plating of 1 m² Cu/l tin bath and beyond (that is to say up to 0.2 mol Cu or 0.09 mol tin/l and even beyond), i.e. 100% of the holes of the board were correctly wetted and penetrated.

What is claimed is:

1. A compound corresponding to formula (I)

$$[(DU)_{a-x}(Me^{a+})_x(DU_{ox}H^+)_y](a \cdot x+y)A^- \quad (I)$$

wherein

| | |
|---|---|
| DU = | a dimer unit of an intrinsically conductive polyaniline polymer, |
| $DU_{ox}$ = | an oxidized form of the dimer unit, |
| $Me^{a+}$ = | a metal ion of valency a, selected from the group consisting of iron, copper, zinc, and magnesium, |
| a = | the valency of the metal ion, |
| x = | an integer from 1 to 10,000, |
| y = | an integer from 0 to 10,000, |
| $A^-$ = | an anion. |

2. Compound according to claim 1, wherein said compound corresponds to one of the following general formulae II or III

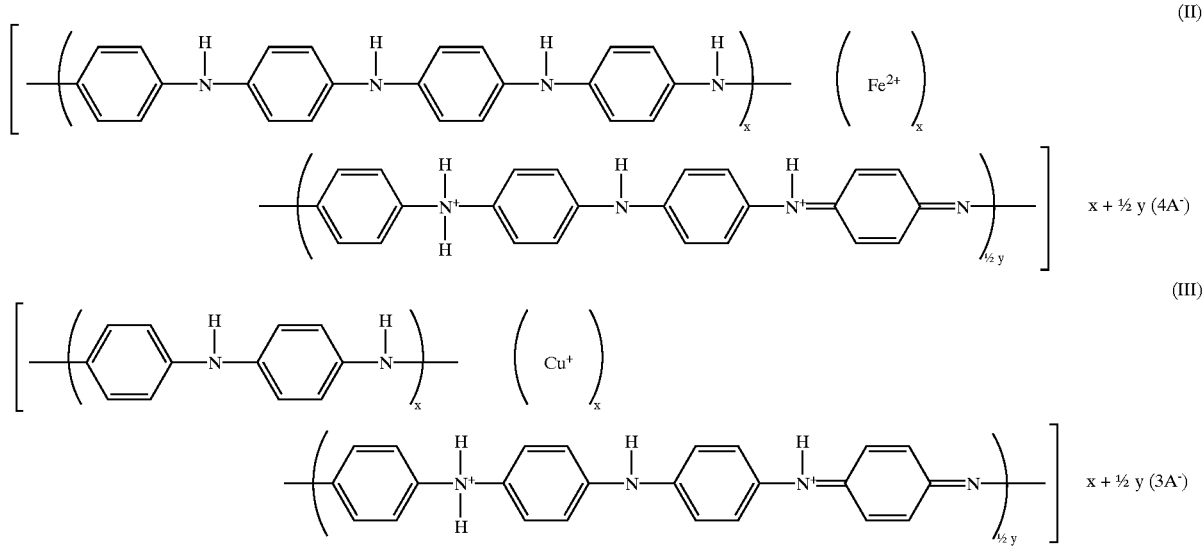

3. Compound according to claim 1, wherein said compound is in the form of one member selected from the group consisting of dispersions in aqueous dispersing agents, dispersions in organic dispersing agents, paints, and polymer blends.

4. Compound according to claim 1, wherein said intrinsically conductive polymer is polyaniline, said metal is one member selected from the group consisting of copper, iron and zinc which, as dispersions in N-methylpyrrolidone and isopropanol, on spectroscopic analysis in the UV-VIS-NIR range, have absorption maxima at wavelengths of copper-polyaniline compound: 285±5 nm,
iron-polyaniline compound: 280±5 nm,
zinc-polyaniline compound: 332±5 nm.

5. Compound according to claim 1, wherein Me is copper.

6. Compound according to claim 1, wherein Me is zinc.

7. Compound according to claim 1, wherein Me is magnesium.

8. Compound according to claim 1, wherein Me is iron.

9. Process for the preparation of the compound according to claim 1, wherein a dispersion of a reduced form of the intrinsically conductive polyaniline polymer is brought into contact with ions of the chosen metal $Me^{a+}$.

10. Method for metallizing a substrate comprising applying the compound of claim 1 the substrate to form a coated substrate and contacting the coated substrate with a metallizing solution to deposit metal thereon.

11. A metallized substrate comprising a substrate, a coating of a compound according to claim 1 and a layer of metal deposited thereon.

12. Method for producing an electrical printed circuit board comprising, pretreating a printed circuit board with a compound according to claim 1 and metallizing the pretreated printed circuit board.

13. An electrical printed circuit board comprising a printed circuit board, a layer of a compound according to claim 1 on the printed circuit board and a metal layer over the layer of said compound.

14. An electrical printed circuit board according to claim 13, wherein said compound is a copper-polyaniline compound.

15. Method for providing corrosion protection to a metal object, comprising, applying to the metal object a coating of a composition comprising a compound according to claim 1.

16. A metal object having corrosion resistance comprising a metal object and a coating of a composition comprising a compound according to claim 1.

17. A compound corresponding to formula (I)

$$[(DU)_{a-x}(Me^{a+})_x(DU_{ox}H^+)_y](a \cdot x+y)A^- \quad (I)$$

wherein

| | |
|---|---|
| DU = | a dimer unit of an intrinsically conductive polyaniline polymer, |
| $DU_{ox}$ = | an oxidized form of the dimer unit, |
| $Me^{a+}$ = | a metal ion of valency a, selected from the group consisting of iron, copper, zinc, and magnesium, |

-continued a = the valency of the metal ion,
x = an integer from 1 to 10,000,
y = an integer from 0 to 10,000, and
A⁻ = an anion, (a) contacting a dispersion of said intrinsically conductive polymer with the chosen metal $Me^{a+}$ in elemental form;
(b) agitating the dispersion medium in order to ensure exchange of matter at the interface between the metal and dispersion, and
(c) maintaining the dispersion in contact with the metal until said compound has formed.

18. Process for the preparation of a compound comprising a metal chemically bonded to an intrinsically conductive polymer comprising (a) contacting a dispersion of an intrinsically conductive polyaniline polymer with the iron, copper, zinc or magnesium metal in elemental form,
(b) agitating the dispersion medium in order to ensure exchange of matter at the interface between the metal and dispersion, and
(c) maintaining the dispersion in contact with the metal until said compound has formed.

19. Process according to claim 18, wherein in (b) the dispersion medium is stirred or flows past the metal.

20. Process according to claim 18, wherein in (c) the dispersion is brought into contact with the metal for a period of 0.1 to 10,000 min.

* * * * *